(12) United States Patent
Lin et al.

(10) Patent No.: US 11,163,227 B2
(45) Date of Patent: Nov. 2, 2021

(54) ILLUMINATION SYSTEM, WAVELENGTH CONVERSION MODULE, PROJECTION APPARATUS AND ILLUMINATION CONTROL METHOD

(71) Applicant: Coretronic Corporation, Hsin-Chu (TW)

(72) Inventors: Chun-Wei Lin, Hsin-Chu (TW); Hsin-Yueh Chang, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 32 days.

(21) Appl. No.: 16/726,837

(22) Filed: Dec. 25, 2019

(65) Prior Publication Data

US 2020/0209726 A1   Jul. 2, 2020

(30) Foreign Application Priority Data

Dec. 28, 2018 (CN) .......................... 201811620745.2

(51) Int. Cl.
  *G03B 21/20* (2006.01)
  *H01L 33/50* (2010.01)

(52) U.S. Cl.
  CPC ........ *G03B 21/2053* (2013.01); *H01L 33/502* (2013.01); *G03B 21/2033* (2013.01); *H01L 2933/0041* (2013.01)

(58) Field of Classification Search
  CPC ............ G03B 21/2053; G03B 21/2033; G03B 21/20; H01L 33/502; H01L 2933/0041; G02B 27/10; G02B 26/008
  See application file for complete search history.

(56) References Cited

U.S. PATENT DOCUMENTS

| | | | | |
|---|---|---|---|---|
| 9,678,418 | B2* | 6/2017 | Jeoung | ................... G03B 21/16 |
| 2009/0284148 | A1* | 11/2009 | Iwanaga | ............ G02B 27/1073 313/506 |

(Continued)

FOREIGN PATENT DOCUMENTS

| CN | 102566230 | 7/2012 |
|---|---|---|
| CN | 205507347 | 8/2016 |

(Continued)

OTHER PUBLICATIONS

"Office Action of China Counterpart Application", dated Nov. 25, 2020, p. 1-p. 10.

*Primary Examiner* — Michelle M Iacoletti
*Assistant Examiner* — Magda Cruz
(74) *Attorney, Agent, or Firm* — JCIPRNET

(57) ABSTRACT

An illumination system, a wavelength conversion module, a projection apparatus and an illumination control method are provided. The illumination system includes excitation light source modules emitting excitation beams and a wavelength conversion module located on a transmission path of the excitation beams and including a substrate, a first region and a second region. The first and second regions are respectively located on a first surface and a second surface of the substrate. When the illumination system is in a high chroma illumination mode, one of the excitation light source modules provides the excitation beams to the first region, and the excitation beams form a first illumination beam through the first region. When the illumination system is in a high brightness illumination mode, one of the excitation light source modules provides the excitation beams to the second region, and the excitation beams form a second illumination beam through the second region.

22 Claims, 11 Drawing Sheets

(56) References Cited

U.S. PATENT DOCUMENTS

| | | | |
|---|---|---|---|
| 2012/0300178 A1* | 11/2012 | Sugiyama | H04N 9/3164 353/31 |
| 2015/0098070 A1* | 4/2015 | Hsieh | F21V 9/38 355/67 |
| 2016/0091712 A1* | 3/2016 | Egawa | G03B 21/204 353/31 |
| 2017/0237953 A1* | 8/2017 | Akiyama | H04N 9/3158 353/31 |
| 2017/0269464 A1* | 9/2017 | Tsai | G03B 21/204 |
| 2017/0293212 A1* | 10/2017 | Wang | G03B 21/208 |
| 2018/0348613 A1* | 12/2018 | Liao | G03B 21/204 |
| 2019/0227416 A1* | 7/2019 | Pan | G03B 21/008 |
| 2019/0235370 A1* | 8/2019 | Weng | G02B 27/1006 |
| 2019/0249833 A1* | 8/2019 | Hsu | F21S 10/007 |
| 2019/0302587 A1* | 10/2019 | Shimizu | G02B 26/008 |
| 2019/0317388 A1* | 10/2019 | Chen | G03B 21/208 |
| 2019/0384149 A1* | 12/2019 | Tsai | G03B 33/08 |

FOREIGN PATENT DOCUMENTS

| | | |
|---|---|---|
| CN | 206610069 | 11/2017 |
| CN | 208239781 | 12/2018 |
| CN | 208969415 | 6/2019 |
| CN | 209265164 | 8/2019 |
| JP | 2012137608 | 7/2012 |

* cited by examiner

ILLUMINATION SYSTEM, WAVELENGTH CONVERSION MODULE, PROJECTION APPARATUS AND ILLUMINATION CONTROL METHOD

CROSS-REFERENCE TO RELATED APPLICATION

This application claims the priority benefit of China application serial no. 201811620745.2, filed on Dec. 28, 2018. The entirety of the above-mentioned patent application is hereby incorporated by reference herein and made a part of this specification.

BACKGROUND

Technical Field

The invention relates to an optical system, an optical module, an optical device including the optical system and a control method, and particularly relates to an illumination system, a wavelength conversion module, a projection apparatus and an illumination control method.

Description of Related Art

Recently, projection apparatuses based on solid-state light sources such as Light-Emitting Diode (LED) and laser diode have gradually taken a place in the market. Generally, excitation lights of these solid-state light sources are converted by a wavelength conversion material on a wavelength conversion module in the projection apparatus to produce converted lights of different colors. In order to satisfy a demand in color performance, a filter module is placed on a rear light path of the projection apparatus, and the converted light on the wavelength conversion module is filtered to form predetermined color light after passing through the filter module. The color lights are modulated into an image beam by a light valve for projecting to external.

It is known that a more cost-effectively way for the projection apparatus adopting the laser diode to produce red or green light is to use a blue laser diode to excite a region containing a green or yellow phosphor in a wavelength conversion module to produce yellow or green light. Moreover, the wavelength conversion region containing the green phosphor corresponds to a green filter region of the filter module to filter the green converted light to produce the desired green light; and the wavelength conversion region containing the yellow phosphor corresponds to a red and yellow filter regions of the filter module to respectively filter the yellow converted light to produce the expected red and yellow light.

However, since it is often needed to design different display modes of the projection apparatus for different usage situations to control a color performance of the image to meet the needs of the user. For example, in a theatre mode, the color performance of the image is required to be high, especially the red color performance, so that it is required to increase a current intensity of the excitation light in the time interval corresponding to the output red color light, so as to make the color performance of the image beam to reach the expected color; however, in a briefing reporting mode, a brightness performance of the image is required to be higher, so that the current intensity of the excitation light in the time interval corresponding to the output green or yellow color light is increased to improve the brightness of the image beam.

However, in this way, for the wavelength conversion module, an energy density of the excitation light taken by the region irradiated by the excitation light in the time interval corresponding to the output red color light in the theatre mode is relatively increased, which probably deteriorate and burn such region to accordingly affect light-emitting efficiency and reliability of the wavelength conversion module and meanwhile affect reliability and color performance of the illumination system and the projection apparatus.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention were acknowledged by a person of ordinary skill in the art.

SUMMARY

The invention is directed to an illumination system, which has good reliability, and an output beam has good color performance.

The invention is directed to a wavelength conversion module, which has good reliability, and an output beam has good color performance.

The invention is directed to a projection apparatus, which has good reliability, and an output beam has good color performance.

The invention is directed to an illumination control method, which is adapted to easily adjust an illumination beam, and make a finally output image beam has good color performance.

Other objects and advantages of the invention may be further illustrated by the technical features broadly embodied and described as follows.

In order to achieve one or a portion of or all of the objects or other objects, an embodiment of the invention provides an illumination system. The illumination system includes a plurality of excitation light source modules and a wavelength conversion module. The excitation light source modules are used for respectively emitting a plurality of excitation beams. The wavelength conversion module is located on a transmission path of the excitation beams, and includes a substrate, a first region and a second region. The substrate has a first surface and a second surface opposite to each other. The first region is located on the first surface of the substrate, and located on the transmission path of the excitation beams, and has a first inner annular region and a first outer annular region, where the first outer annular region surrounds the first inner annular region. The second region is located on the second surface of the substrate, and is located on the transmission path of the excitation beams, and has a second inner annular region and a second outer annular region, where the second outer annular region surrounds the second inner annular region.

In order to achieve one or a portion of or all of the objects or other objects, an embodiment of the invention provides a wavelength conversion module. The wavelength conversion module includes a substrate, a first region and a second region. The substrate has a first surface and a second surface opposite to each other. The first region is located on the first surface of the substrate, and has a first inner annular region and a first outer annular region, where the first outer annular region surrounds the first inner annular region. The second region is located on the second surface of the substrate, and has a second inner annular region and a second outer annular region, where the second outer annular region surrounds the second inner annular region.

In order to achieve one or a portion of or all of the objects or other objects, an embodiment of the invention provides a projection apparatus. The projection apparatus includes the aforementioned illumination system, at least one light valve and a projection lens. The light valve is disposed on the transmission path of the illumination beam, and is configured to convert the illumination beam into an image beam. The projection lens is disposed on a transmission path of the image beam, and is configured to convert the image beam into a projection beam.

In order to achieve one or a portion of or all of the objects or other objects, an embodiment of the invention provides an illumination control method adapted to control an illumination system in a projection apparatus. The illumination system has a high chroma illumination mode and a high brightness illumination mode, and includes a plurality of excitation light source modules and a wavelength conversion module. The excitation light source modules are used for respectively emitting a plurality of excitation beams, and the wavelength conversion module is located on a transmission path of the excitation beams, and includes a substrate, a first region and a second region, the substrate has a first surface and a second surface opposite to each other, the first region is located on the first surface of the substrate, and the second region is located on the second surface of the substrate. The illumination control method includes following steps. When the illumination system is in the high chroma illumination mode, one of the excitation light source modules provides the excitation beams to the first region, and the excitation beams form a first illumination beam through the first region, or when the illumination system is in the high brightness illumination mode, one of the excitation light source modules provides the excitation beams to the second region, and the excitation beams form a second illumination beam through the second region.

Based on the above description, the embodiments of the invention have at least one of following advantages or effects. In the embodiments of the invention, in the illumination system and the projection apparatus, by respectively configuring the wavelength conversion regions of different structures on the first surface and the second surface of the substrate of the wavelength conversion module, the excitation beams are adapted to irradiate the corresponding wavelength conversion regions on the different surfaces of the wavelength conversion module when the different illumination modes are selected. In this way, in the illumination system and the projection apparatus, a range or material of each of the wavelength conversion regions on different surfaces of the wavelength conversion module may be correspondingly configured according to the demand of the illumination mode, so as to balance reliability of the illumination system and the projection apparatus and color performance of the output beam, and adjust a color mixing ratio more widely. Moreover, the illumination control method of the embodiment of the invention may easily adjust the illumination beam in the illumination system and the projection apparatus, such that the excitation beams may irradiate the corresponding wavelength conversion regions on different surfaces of the wavelength conversion module when different illumination modes are selected, and therefore the finally output image beam has good color performance.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
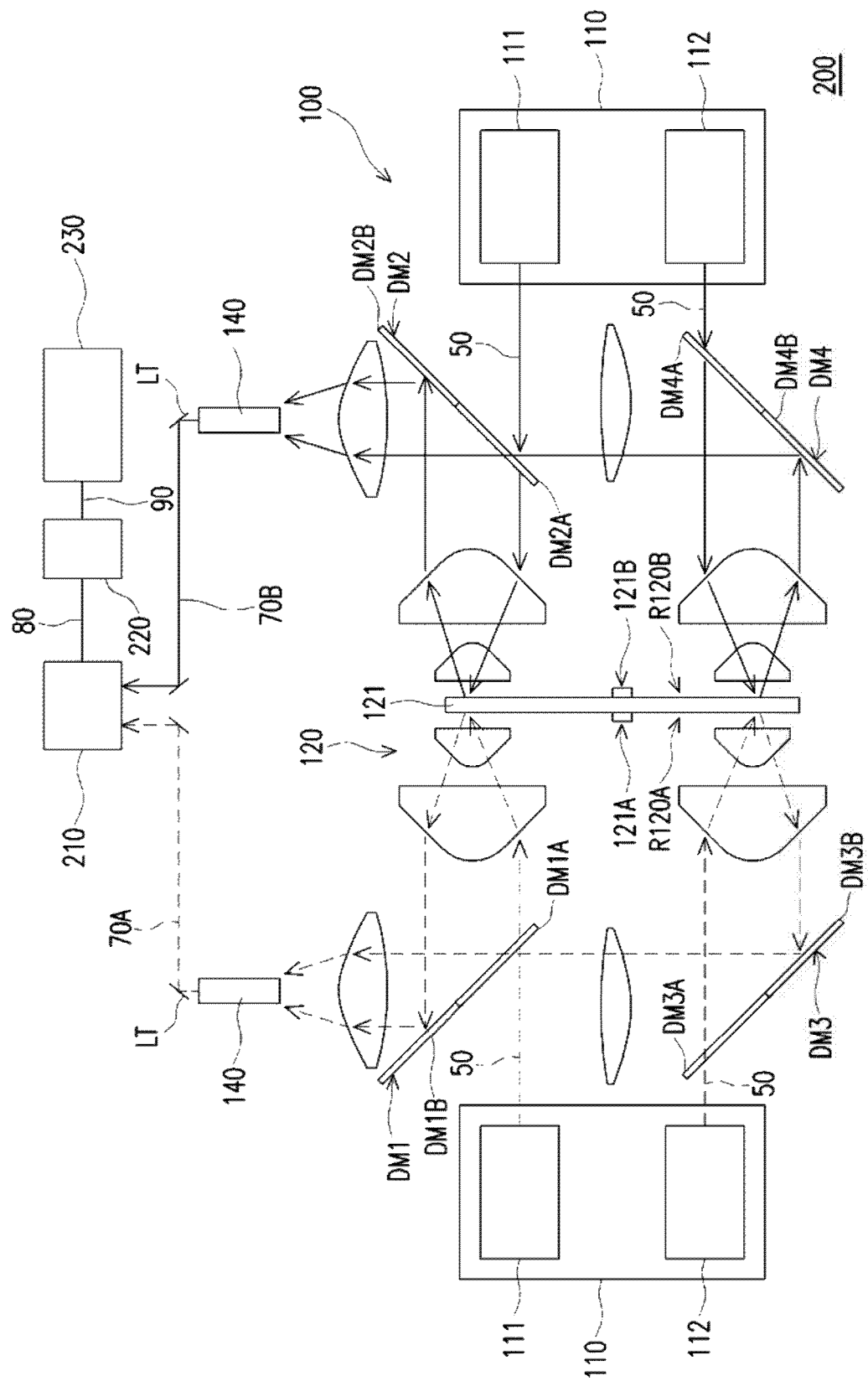
FIG. 1 is a schematic diagram of an optical framework of a projection apparatus according to an embodiment of the invention.

FIG. 1 is a schematic diagram of an optical framework of a projection apparatus according to an embodiment of the invention. Referring to FIG. 1, the projection apparatus 200 includes an illumination system 100, at least one light valve 210 and a projection lens 220. For example, in the embodiment, the light valve 210 is a Digital Micro-mirror Device (DMD) or a Liquid-Crystal-On-Silicon (LCOS) panel. However, in other embodiments, the light valve 210 may also be a transmissive liquid crystal panel or other light modulator, and the number of the at least one light valve is not limited.

To be specific, as shown in FIG. 1, in the embodiment, the illumination system 100 includes a plurality of excitation light source modules 110 and a wavelength conversion module 120. As shown in FIG. 1, each of the excitation light source modules 110 includes a first excitation light source 111 and a second excitation light source 112, which are respectively configured to emit a plurality of excitation beams 50. In the embodiment, the first excitation light source 111 and the second excitation light source 112 of the excitation light source module 110 are laser light sources, and the excitation beams 50 are blue laser beams. For example, the first excitation light source 111 and the second excitation light source 112 may include a plurality of blue laser diodes (not shown) arranged in an array, though the invention is not limited thereto. Moreover, in the embodiment, the blue laser beams produced by the first excitation light source 111 and the second excitation light source 112 have the same wavelength, and a wavelength range of the blue laser beams is, for example, 440-460 nm. In other embodiments, the blue laser beams produced by the first excitation light source 111 and the second excitation light source 112 may have different wavelengths, and the wavelength range of the blue laser beams is, for example, 440-460 nm.

On the other hand, as shown in FIG. 1, in the embodiment, the wavelength conversion module 120 is located on a transmission path of the excitation beams 50, and the wavelength conversion module 120 includes a substrate 121, a first region R120A and a second region R120B. The substrate 121 has an axle center (not shown), and the substrate 121 has a first surface 121A and a second surface 121B opposite to each other. The first region R120A is located on the first surface 121A of the substrate 121, and located on the transmission path of the excitation beams 50. The second region R120B is located on the second surface 121B of the substrate 121, and is located on the transmission path of the excitation beams 50.

Detailed structures of the first region R120A and the second region R120B of the wavelength conversion module 120 are described below with reference of FIG. 2A to FIG. 2B.

Figure 2A:
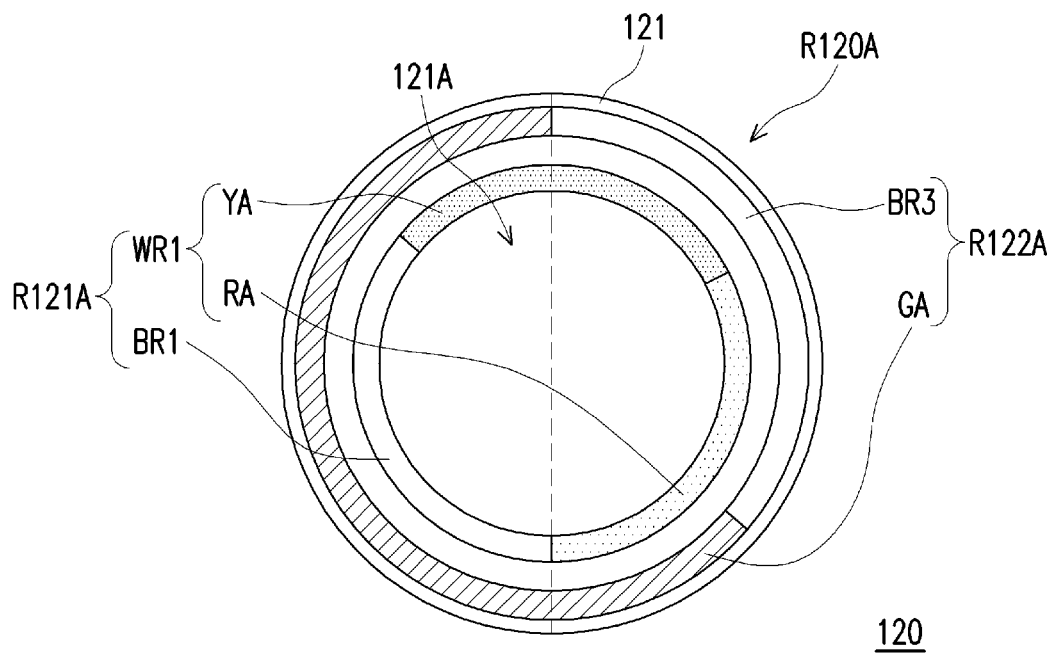
FIG. 2A is a front view of a first region of the wavelength conversion module of FIG. 1.

FIG. 2A is a front view of the first region R120A of the wavelength conversion module 120 of FIG. 1. FIG. 2B is a front view of the second region R120B of the wavelength conversion module 120 of FIG. 1. To be specific, as shown in FIG. 2A, in the embodiment, the first region R120A has a first inner annular region R121A and a first outer annular region R122A, where the first outer annular region R122A surrounds the first inner annular region R121A. The first inner annular region R121A is disposed between the axle center and the first outer annular region R122A. Further, the first inner annular region R121A has a first reflection region BR1 and a first wavelength conversion region WR1. Moreover, the first wavelength conversion region WR1 of the first inner annular region R121A includes a first sub-wavelength conversion region YA and a second sub-wavelength conversion region RA. Moreover, the first outer annular region R122A of the first region R120A has a third reflection region BR3 and a third wavelength conversion region GA. The first reflection region BR1 and the third reflection region BR3 have an effect of reflecting the excitation beams 50. In other embodiments, a diffuser may also be configured to spoil coherence of the excitation beams 50.

Figure 2B:
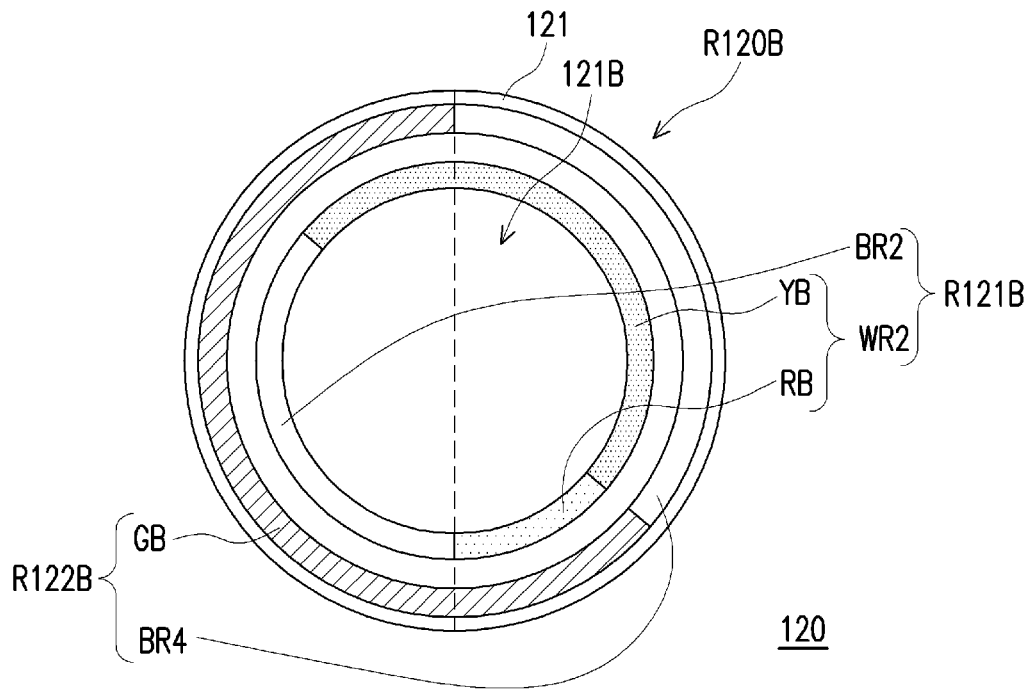
FIG. 2B is a front view of a second region of the wavelength conversion module of FIG. 1.

On the other hand, as shown in FIG. 2B, in the embodiment, the second region R120B has a second inner annular region R121B and a second outer annular region R122B, where the second outer annular region R122B surrounds the second inner annular region R121B. The second inner annular region R121B is disposed between the axle center and the second outer annular region R122B. Further, the second inner annular region R121B has a second reflection region BR2 and a second wavelength conversion region WR2. Moreover, the second wavelength conversion region WR2 of the second inner annular region R121B includes a third sub-wavelength conversion region YB and a fourth sub-wavelength conversion region RB. Moreover, the second outer annular region R122B of the second region R120B has a fourth reflection region BR4 and a fourth wavelength conversion region GB.

To be specific, in the embodiment, the first wavelength conversion region WR1 of the first region R120A includes a first wavelength conversion material and a first bonding material, and the second wavelength conversion region WR2 of the second region R120B includes the first wavelength conversion material and a second bonding material. In the second embodiment, the first bonding material and the second bonding material are the same, which may be implemented by organic adhesion material such as silica gel, etc. In the embodiment, the first wavelength conversion material is, for example, a wavelength conversion material adapted to convert the excitation beam 50 into a yellow beam, and the first wavelength conversion material represents a yellow wavelength conversion material. Moreover, the third reflection region BR3 of the first region R120A and the fourth reflection region BR4 of the second region R120B may also be configured with diffusers to spoil coherence of the excitation beams 50 and make the excitation beams 50 to for blue light.

To be specific, in the embodiment, the first sub-wavelength conversion region YA of the first inner annular region R121A of the first region R120A and the third sub-wavelength conversion region YB of the second inner annular region R121B of the second region R120B corresponds to each other, and the second sub-wavelength conversion region RA of the first inner annular region R121A of the first region R120A and the fourth sub-wavelength conversion region RB of the second inner annular region R121B of the second region R120B corresponds to each other. The third wavelength conversion region GA of the first outer annular region R122A of the first region R120A and the fourth wavelength conversion region GB of the second outer annular region R122B of the second region R120B corresponds to each other. The meaning of "corresponding to each other" refers to that when the excitation beam 50 irradiates the wavelength conversion regions corresponding to each other, colors of the color lights converted by the wavelength conversion regions and output by the illumination system 100 are the same.

How the illumination system 100 forms various color lights of the illumination beam under different modes is described below with reference of FIG. 3A to FIG. 4H.

Figure 3A:
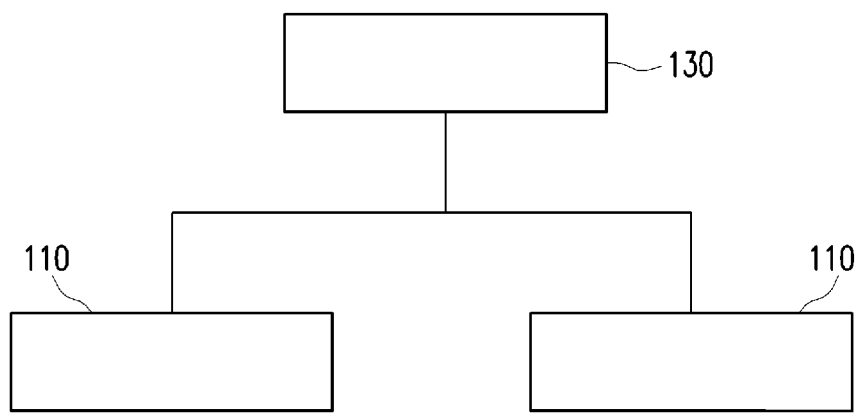
FIG. 3A is a block diagram of a control module and other components according to an embodiment of the invention.
Figure 3B:
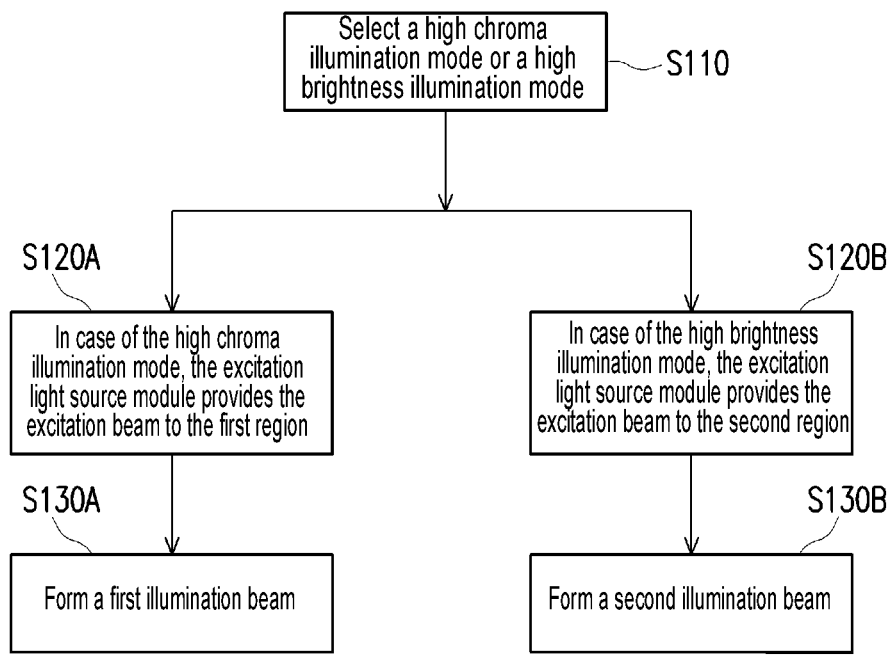
FIG. 3B is a flowchart illustrating an illumination control method according to an embodiment of the invention.

FIG. 3A is a block diagram of a control module 130 and other components according to an embodiment of the invention. FIG. 3B is a flowchart illustrating an illumination control method according to an embodiment of the invention. To be specific, in the embodiment, the illumination system 100 has a high chroma illumination mode (for example, a theater mode) and a high brightness illumination mode, and as shown in FIG. 3A, the illumination system 100 further includes the control module 130, and the control module 130 is electrically connected to each of the excitation light source modules 110. In this way, the control module 130 may control operations of the illumination system 100 and the projection apparatus 200 by switching switches of each of the excitation light source modules 110. For example, the illumination system 100 and the projection apparatus 200 shown in FIG. 1 and FIG. 3A may execute the illumination control method of FIG. 3B, such that when the illumination system 100 is in the high chroma illumination mode, the control module 130 controls to turn on the excitation light source module 110 located at a left side of FIG. 3A to emit the excitation beams 50 (for example, a left side of FIG. 1), and the excitation beams 50 pass through the first region R120A to form a first illumination beam 70A, and when the illumination system 100 is in the high brightness illumination mode, the control module 130 controls to turn on the excitation light source module 110 located at a right side of FIG. 3A to emit the excitation beams 50 (for example, a right side of FIG. 1), and the excitation beams 50 pass through the second region R120B to form a second illumination beam 70B, though the invention is not limited thereto. It should be noted that when the illumination system 100 is in the high chroma illumination mode, the control module 130 controls to turn on the excitation light source module 110 located at the left side of FIG. 3A, and meanwhile the control module 130 controls to turn off the excitation light source module 110 located at the right side of FIG. 3A. When the illumination system 100 is in the high brightness illumination mode, the control module 130 controls to turn on the excitation light source module 110 located at the right side of FIG. 3A, and meanwhile the control module 130 controls to turn off the excitation light source module 110 located at the left side of FIG. 3A.

To be specific, as shown in FIG. 3B, in the embodiment, the control module 130 is configured to execute a step S110, and the control module 130 selects the high chroma illumination mode or the high brightness illumination mode. The control module 130 controls each of the excitation light source modules 110 to respectively execute a step S120A and a step S130A or a step S120B and a step S130B. In detail, as shown in FIG. 3B, in the embodiment, when the illumination system 100 is in the high chroma illumination mode, the control module 130 executes the step S120A to control one of the excitation light source modules 110 to provide the excitation beams 50 to the first region R120A, and executes the step S130A to form the first illumination beam 70A.

To be more specific, in the embodiment, when the illumination system 100 is in the high chroma illumination mode, the control module 130 controls to turn on the excitation light source module 110 located at the left side of FIG. 3A, and the control module 130 respectively turns on or turns off the first excitation light source 111 and the second excitation light source 112 to provide the excitation beams 50 to the first region R120A in different time intervals, so as to form the first illumination beam 70A respectively including first color light L1, second color light L2, third color light L3 and fourth color light L4 in different time intervals. In the embodiment, the first color light L1, the second color light L2, the third color light L3 and the fourth color light L4 are respectively red light, green light, yellow light and blue light, which is further described below with reference of FIG. 4A to FIG. 4H.

Figure 4A:
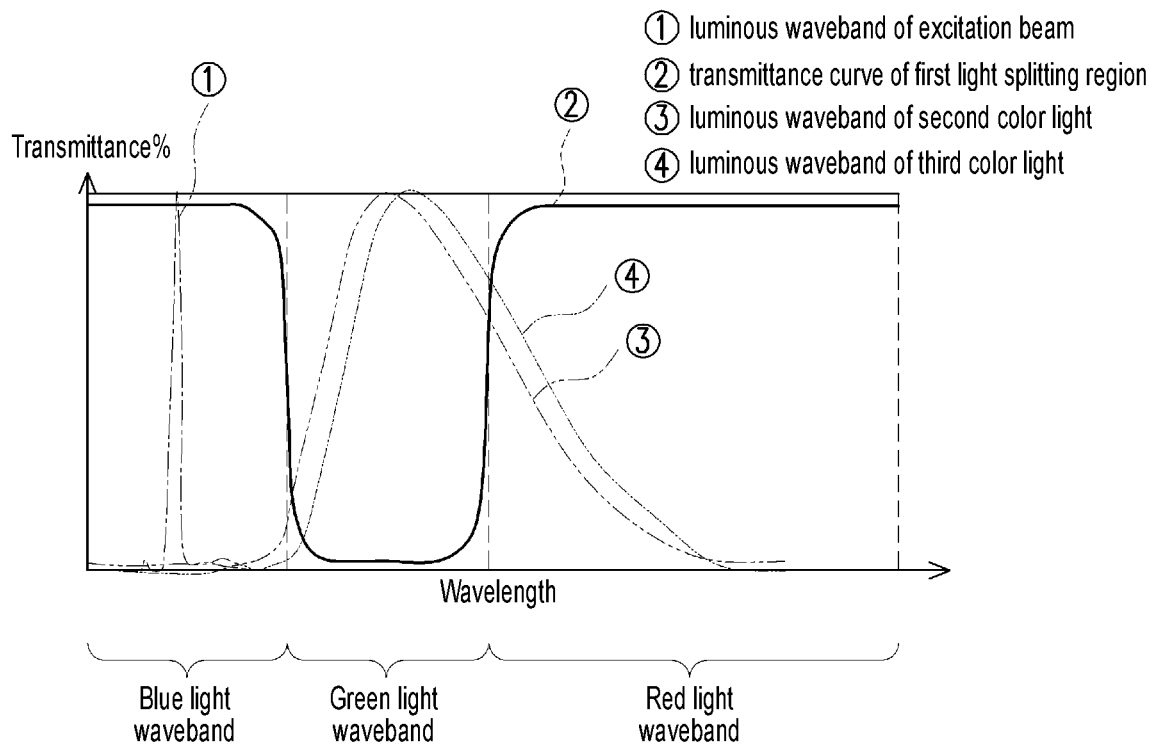
FIG. 4A is a relationship diagram of transmittances and luminous wavelengths of a first light splitting region of a first light splitting element of FIG. 1 for different color lights.
Figure 4B:
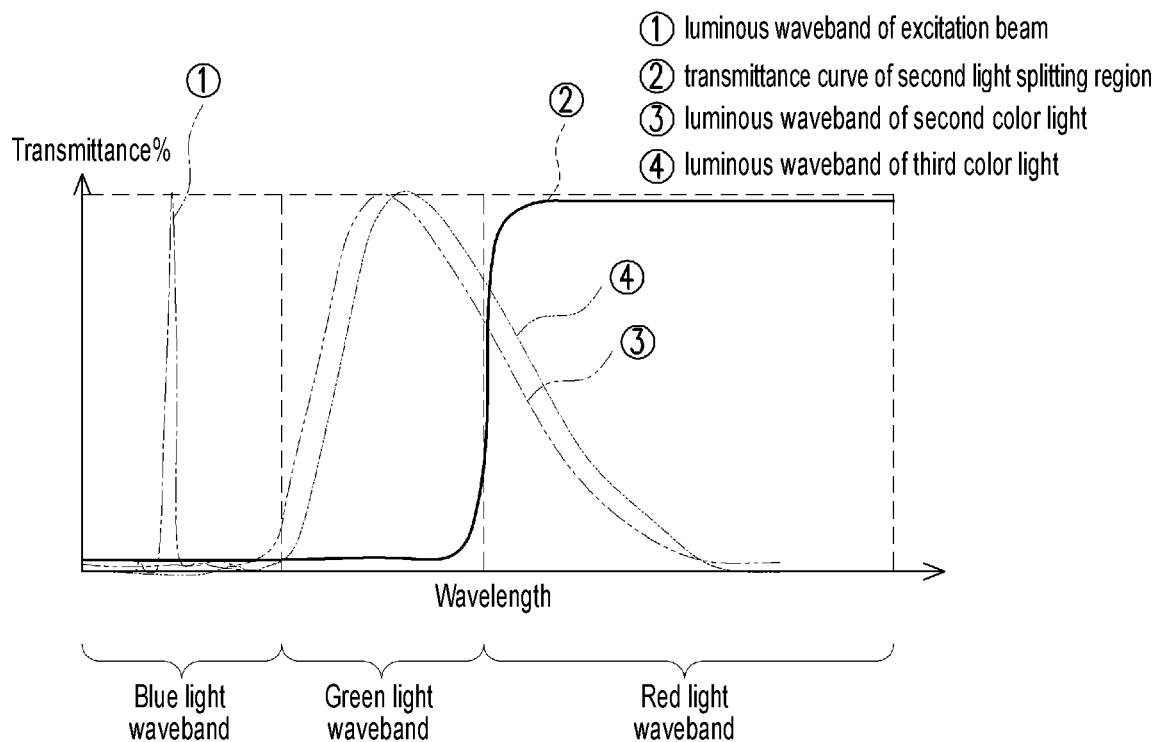
FIG. 4B is a relationship diagram of transmittances and luminous wavelengths of a second light splitting region of the first light splitting element of FIG. 1 for different color lights.
Figure 4C:
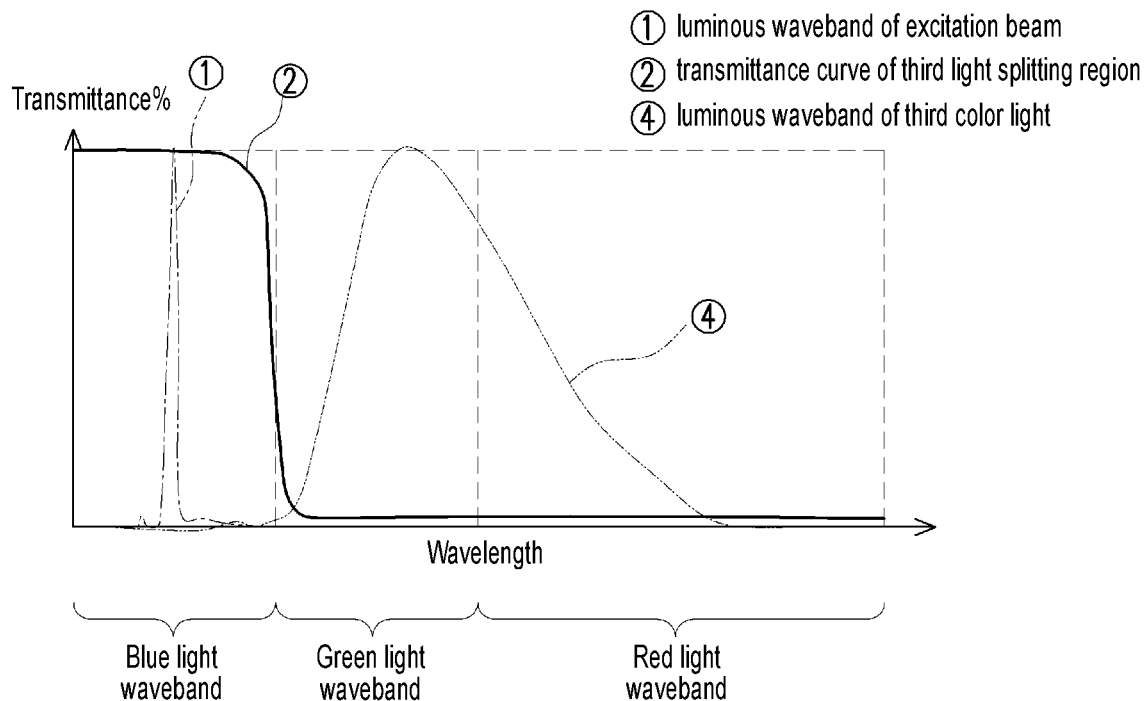
FIG. 4C is a relationship diagram of transmittances and luminous wavelengths of a third light splitting region of a third light splitting element of FIG. 1 for different color lights.
Figure 4D:
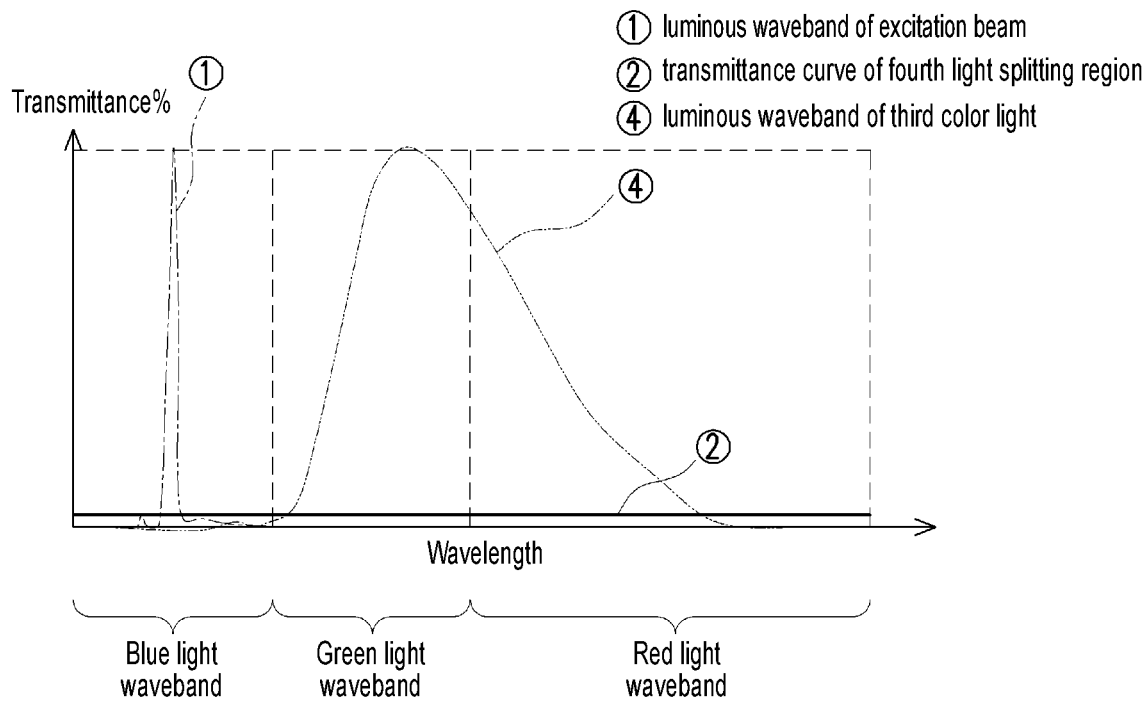
FIG. 4D is a relationship diagram of transmittances and luminous wavelengths of a fourth light splitting region of the third light splitting element of FIG. 1 for different color lights.

FIG. 4A is a relationship diagram of transmittances and luminous wavelengths of a first light splitting region of a first light splitting element of FIG. 1 for different color lights. FIG. 4B is a relationship diagram of transmittances and luminous wavelengths of a second light splitting region of the first light splitting element of FIG. 1 for different color lights. FIG. 4C is a relationship diagram of transmittances and luminous wavelengths of a third light splitting region of a third light splitting element of FIG. 1 for different color lights. FIG. 4D is a relationship diagram of transmittances and luminous wavelengths of a fourth light splitting region of the third light splitting element of FIG. 1 for different color lights. FIG. 4E to FIG. 4H are schematic diagrams of light paths of different color lights of the projection apparatus of FIG. 1. To be specific, as shown in FIG. 1 and FIG. 4A to FIG. 4H, in the embodiment, referring to FIG. 1, the illumination system 100 further includes a first light splitting element DM1, a second light splitting element DM2, a third light splitting element DM3 and a fourth light splitting element DM4. The first light splitting element DM1 and the third light splitting element DM3 are located on transmission paths of lights coming from the first region R120A, and the first light splitting element DM1 has a first light splitting region DM1A and a second light splitting region DM1B, and the third light splitting element DM3 has a third light splitting region DM3A and a fourth light splitting region DM3B. For example, as shown in FIG. 4A, the first light splitting region DM1A of the first light splitting element DM1 may, for example, reflect the green light, and let the beams of other colors (for example, the red light and the blue light) to pass through. Moreover, as shown in FIG. 4B, the second light splitting region DM1B of the first light splitting element DM1 may, for example, reflect the green light and the blue light, and let the beams of other colors (for example, the red light) to pass through. On the other hand, as shown in FIG. 4C, the third light splitting region DM3A of the third light splitting element DM3 may, for example, let the blue light to pass through, but reflect the beams of other colors (for example, the red light, the green light or the yellow light). As shown in FIG. 4D, the fourth light splitting region DM3B of the third light splitting element DM3 may reflect the beams of all of the colors. In other words, in the embodiment, the fourth light splitting region DM3B of the third light splitting element DM3 is a reflecting element, for example, a reflecting coating. The aforementioned light splitting elements are, for example, dichroic mirrors, and the light splitting regions may be dichroic coatings.

Moreover, as shown in FIG. 1, FIG. 4A to FIG. 4H, in the embodiment, the second light splitting element DM2 and the fourth light splitting element DM4 are located on transmission paths of lights coming from the second region R120B, and the second light splitting element DM2 is the same with the first light splitting element DM1, the fourth light splitting element DM4 is the same with the third light splitting element DM3. The second light splitting element DM2 has a first light splitting region DM2A and a second light splitting region DM2B, and the fourth light splitting element DM4 has a third light splitting region DM4A and a fourth light splitting region DM4B.

It should be noted that the yellow light coming from the first region R120A may be reflected by the third light splitting region DM3A and the fourth light splitting region DM3B of the third light splitting element DM3, and is filtered by the first light splitting region DM1A and the second light splitting region DM1B of the first light splitting element DM1 to leave the red light (to reflect or adsorb a part of wavelengths in the yellow light, and let a part of wavelengths in the yellow light to pass through), where a color of a part of the wavelengths penetrating through the first light splitting region DM1A and the second light splitting region DM1B is the red light, and the red light leaves the first light splitting element DM1. Alternatively, the yellow light coming from the second region R120B may be reflected by the third light splitting region DM4A and the fourth light splitting region DM4B of the fourth light splitting element DM4, and is filtered by the first light splitting region DM2A and the second light splitting region DM2B of the second light splitting element DM2 to leave the red light, and the red light leaves the second light splitting element DM2.

In this way, as shown in FIG. 1, FIG. 3A, FIG. 3B and FIG. 4E to FIG. 4H, when the illumination system 100 is in the high chroma illumination mode, the method that the control module 130 executes the step S120 may include following steps.

Figure 4E:
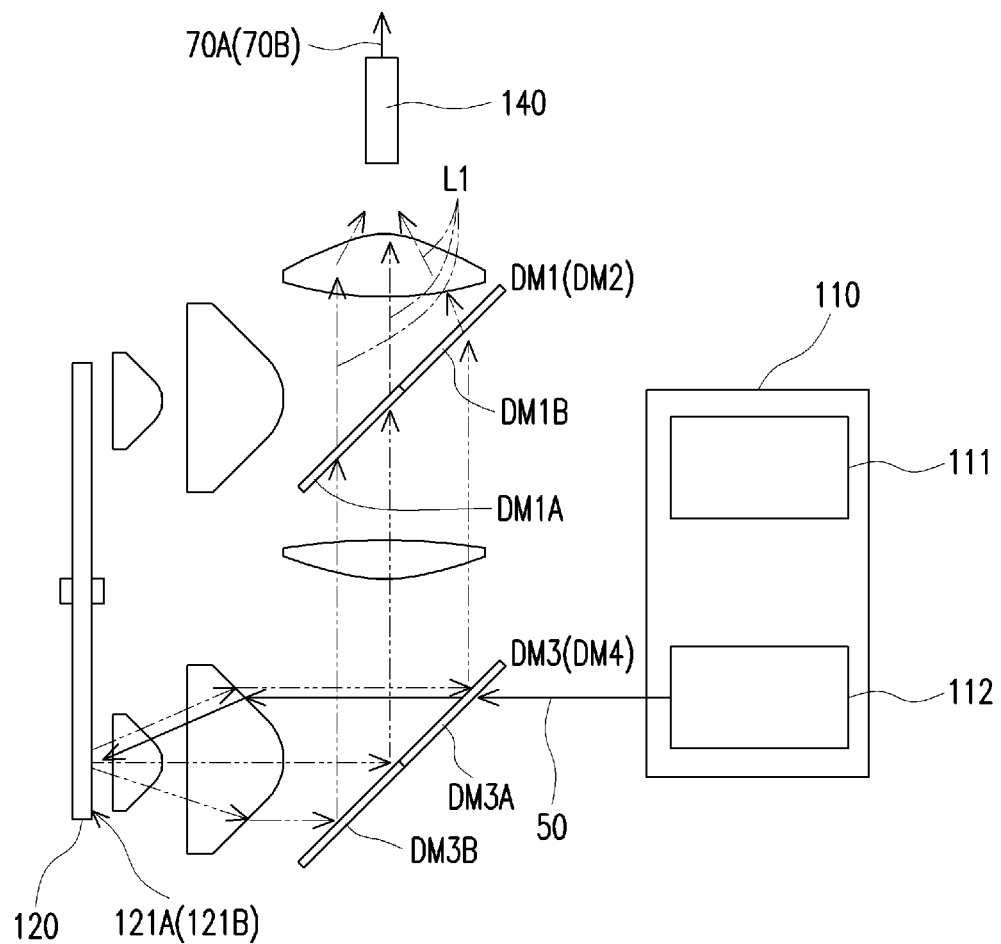
FIG. 4E to FIG. 4H are schematic diagrams of light paths of different color lights of the projection apparatus of FIG. 1.

First, as shown in FIG. 4E, the control module 130 turns off the first excitation light source 111 and turns on the second excitation light source 112 during a first time interval, in this way, the excitation beam 50 may first penetrate through the third light splitting region DM3A of the third light splitting element DM3, and is incident to the second sub-wavelength conversion region RA of the first inner annular region R121A to form the third color light L3. Thereafter, the third color light L3 coming from the second sub-wavelength conversion region RA is transmitted to the first light splitting element DM1 after being reflected by the third light splitting region DM3A and the fourth light splitting region DM3B of the third light splitting element DM3, and is filtered by the first light splitting region DM1A and the second light splitting region DM1B of the first light splitting element DM1 (to reflect or adsorb a part of wavelengths, and let a part of wavelengths to pass through) to form the first color light L1 of the first illumination beam 70A.

Figure 4F:
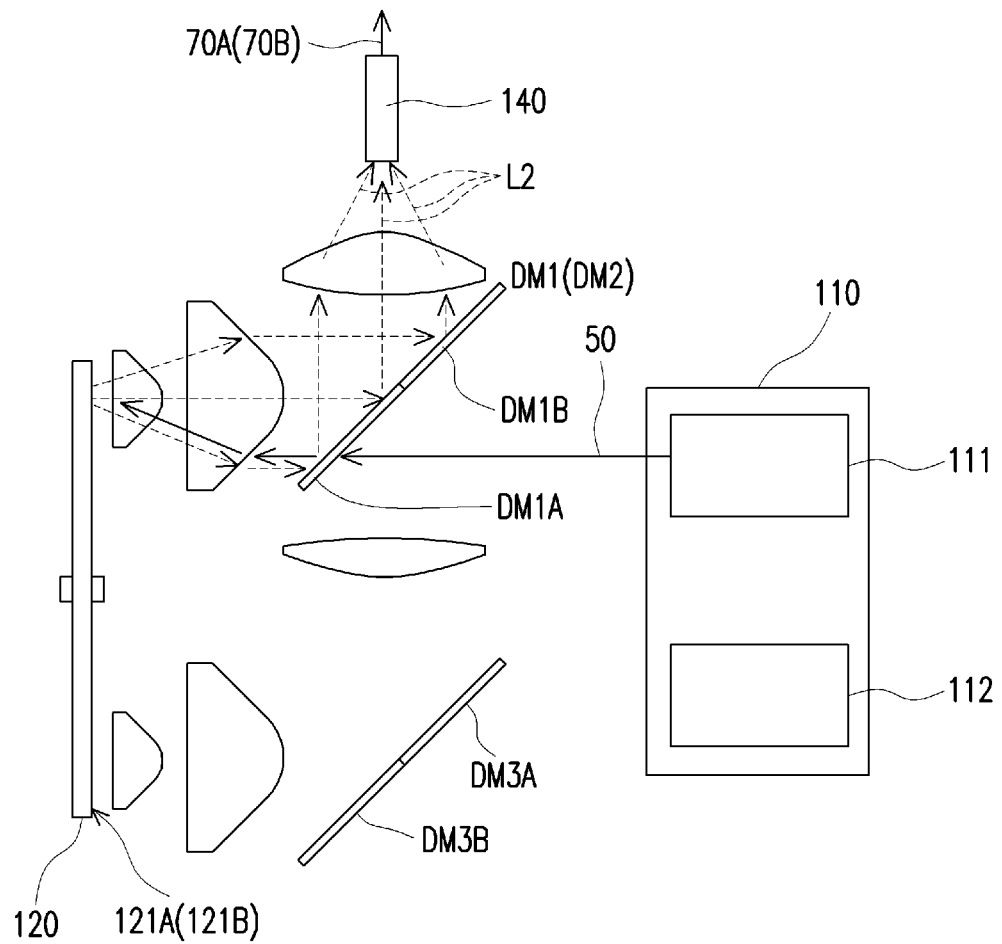

Then, as shown in FIG. 4F, the control module 130 turns on the first excitation light source 111 and turns off the second excitation light source 112 during a second time interval, in this way, the excitation beam 50 may first penetrate through the first light splitting region DM1A of the first light splitting element DM1, and is incident to the third wavelength conversion region GA of the first outer annular region R122A to form the second color light L2. Thereafter, the second color light L2 coming from the third wavelength conversion region GA of the first outer annular region R122A is transmitted to the subsequent optical elements after being reflected by the first light splitting region DM1A and the second light splitting region DM1B of the first light splitting element DM1 to form the second color light L2 of the first illumination beam 70A.

Figure 4G:
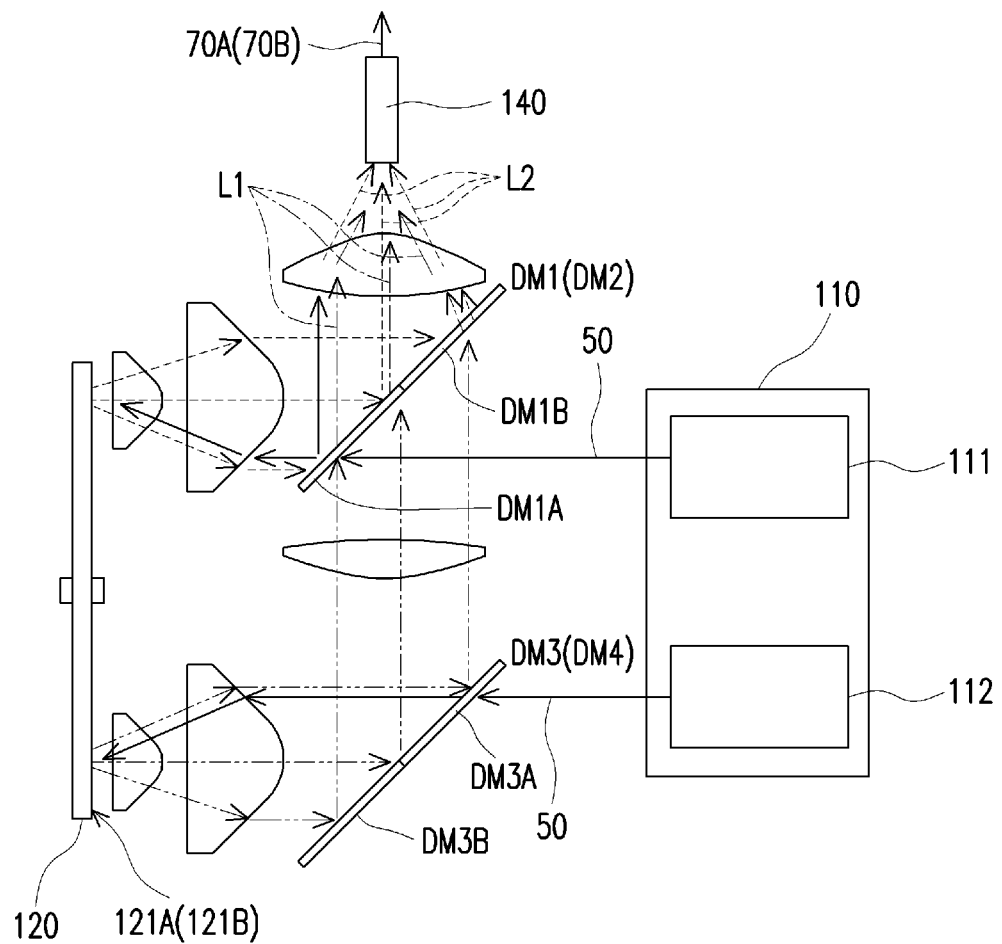

Then, as shown in FIG. 4G, the control module 130 simultaneously turns on the first excitation light source 111 and the second excitation light source 112 during a third time interval, and when the excitation beams 50 respectively penetrate through the third light splitting region DM3A of the third light splitting element DM3 and the first light splitting region DM1A of the first light splitting element DM1 to irradiate the first sub-wavelength conversion region YA of the first inner annular region R121A and the third wavelength conversion region GA of the first outer annular region R122A, the excitation beams 50 may form the third color light L3 through the first sub-wavelength conversion region YA of the first inner annular region R121A and form the second color light L2 through the third wavelength conversion region GA of the first outer annular region R122A. Thereafter, the third color light L3 coming from the first sub-wavelength conversion region YA is reflected by the third light splitting region DM3A and the fourth light splitting region DM3B of the third light splitting element DM3 and transmitted to the first light splitting element DM1, and is filtered by the first light splitting region DM1A and the second light splitting region DM1B of the first light splitting element DM1 to form the first color light L1 for transmitting to the subsequent optical elements, and the second color light L2 coming from the third wavelength conversion region GA of the first outer annular region R122A is reflected by the first light splitting region DM1A and the second light splitting region DM1B of the first light splitting element DM1 and transmitted to the subsequent optical elements. Moreover, as shown in FIG. 4G, the filtered first color light L1 and the second color light L2 coming from the first light splitting element DM1 may be mixed into the third color light L3 to form the third color light L3 of the first illumination beam 70A.

Figure 4H:
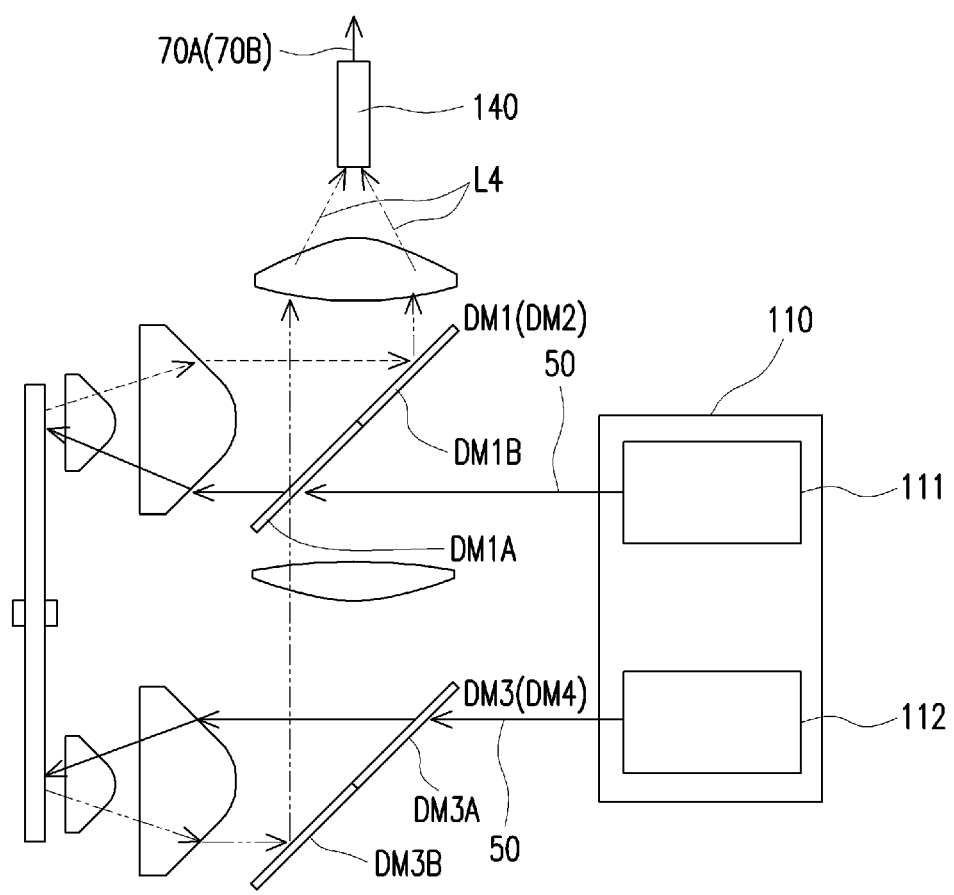

Then, as shown in FIG. 4H, when the control module 130 simultaneously turns on the first excitation light source 111 and the second excitation light source 112 during a fourth time interval, and the excitation beams 50 respectively penetrate through the third light splitting region DM3A of the third light splitting element DM3 and the first light splitting region DM1A of the first light splitting element DM1 to irradiate the first reflection region BR1 and the third reflection region BR3, the excitation beams 50 form the fourth color light L4 through the first reflection region BR1 and the third reflection region BR3, and are reflected by the fourth light splitting region DM3B of the third light splitting element DM3 and the second light splitting region DM1B of the first light splitting element DM1 for transmitting to the subsequent optical elements to form the fourth color light L4 of the first illumination beam 70A.

In this way, after the steps shown in FIG. 4E to FIG. 4H are completed, the control module 130 completes the step S130A to form the first illumination beam 70A including the first color light L1, the second color light L2, the third color light L3 and the fourth color light L4.

On the other hand, referring to FIG. 3B again, in the embodiment, when the illumination system 100 is in the high brightness illumination mode, the control module 130 executes the step S120B to control the excitation light source modules 110 to provide the excitation beams 50 to the second region R120B, and executes the step S130B to form the second illumination beam 70B.

Similar to the steps S120A and S130A, when the illumination system 100 is in the high brightness illumination mode, the control module 130 executes the steps S120B and S130B may also respectively turn on or turn of the first excitation light source 111 and the second excitation light source 112 used for providing the excitation beams 50 to the second region R120B during different time intervals, so as to form the second illumination beam 70B including the first color light L1, the second color light L2, the third color light L3 and the fourth color light L4 during the different time intervals. Moreover, the method that the control module 130 executes the steps S120B and S130B may refer to the steps shown in FIG. 4E to FIG. 4H.

For example, as shown in FIG. 4E, when the illumination system 100 is in the high brightness illumination mode, the control module 130 may turn off the first excitation light source 111 and turn on the second excitation light source 112 during the first time interval, such that the excitation beam 50 forms the first color light L1 of the second illumination beam 70B through the fourth sub-wavelength conversion region RB of the second inner annular region R121B. As shown in FIG. 4F, the control module 130 may turn on the first excitation light source 111 and turn off the second excitation light source 112 during the second time interval, such that the excitation beam 50 forms the second color light L2 of the second illumination beam 70B through the fourth sub-wavelength conversion region GB of the second outer annular region R122B. As shown in FIG. 4G, the control module 130 simultaneously turns on the first excitation light source 111 and the second excitation light source 112 during the third time interval, and the excitation beams 50 irradiate the third sub-wavelength conversion region YB of the second inner annular region R121B to form the third color light L3, and irradiate the fourth wavelength conversion region GB of the second outer annular region R122B to form the second color light L2, and after being filtered by the second light splitting element DM2, the third color light L3 and the second color light L2 form the third color light L3 of the second illumination beam 70B. As shown in FIG. 4H, when the control module 130 simultaneously turns on the first excitation light source 111 and the second excitation light source 112 during the fourth time interval, and the excitation beams 50 irradiate the second reflection region BR2 and the fourth reflection region BR4, the excitation beams 50 form the fourth color light L4 through the second reflection region BR2 and the fourth reflection region BR4. Other detailed descriptions may refer to related paragraphs, and details thereof are not repeated.

To be specific, referring to FIG. 2A and FIG. 2B again, in the embodiment, the first region R120A and the second region R120B are fabricated at two side edges of the substrate 121. By placing the first region R120A and the second region 120B on the same reference plane, the first wavelength conversion region WR1 of the first inner annular region R121A of the first region R120A and the second wavelength conversion region WR2 of the second inner annular region R121B of the first region R120A have the same angle. However, the second sub-wavelength conversion region RA of the first inner annular region R121A and the fourth sub-wavelength conversion region RB of the second inner annular region R121B have different angles. For example, the first wavelength conversion region WR1 of the first inner annular region R121A is, for example, 240 degrees, though the invention is not limited thereto. To be more specific, an angle range of the second sub-wavelength conversion region RA of the first inner annular region R121A is greater than an angle range of the fourth sub-wavelength conversion region RB of the second inner annular region R121B. In this way, when the illumination system 100 is in the high chroma illumination mode, since the angle range of the second sub-wavelength conversion region RA of the first inner annular region R121A is large, the first illumination beam 70A may have a high proportion of red light, so as to satisfy the requirement on the color performance of an output projection beam 90. On the other hand, when the illumination system 100 is in the high brightness illumination mode, since the angle range of the third sub-wavelength conversion region YB of the second inner annular region R121B is large, the second illumination beam 70B may have a low proportion of red light and a high proportion of yellow light, so as to enhance a brightness of the output beam.

Then, referring to FIG. 1 again, the illumination system 100 further includes a plurality of light uniforming elements 140. The light uniforming elements 140 are located between the first light splitting element DM1 and the light valve 210, or located between the second light splitting element DM2 and the light valve 210, and the light uniforming elements 140 are respectively located on the transmission paths of the first illumination beam 70A and the second illumination beam 70B. In the embodiment, the light uniforming element 140 includes an integration rod, though the invention is not limited thereto. To be more specific, as shown in FIG. 1, after the illumination system 100 respectively forms the first illumination beam 70A or the second illumination beam 70B according to the selected illumination mode, the first illumination beam 70A or the second illumination beam 70B is transmitted to the light uniforming element 140, and the first illumination beam 70A or the second illumination beam 70B is uniformed by the light uniforming element 140, and is transmitted to the light valve 210 through a light transmitting module LT.

Then, as shown in FIG. 1, the light valve 210 is located on the transmission path of the first illumination beam 70A or the second illumination beam 70B, and is used for converting the first illumination beam 70A or the second illumination beam 70B into an image beam 80. The projection lens 220 is located on a transmission path of the image beam 80, and is used for converting the image beam 80 into a projection beam 90, so as to project the image beam 80 onto a screen 230 to form an image. After the first illumination beam 70A or the second illumination beam 70B is converged to the light valve 210, since the light valve 210 converts the first illumination beam 70A or the second illumination beam 70B into the image beam 80 of different colors in timing and transmits the image beam 80 to the projection lens 220, the image projected from the image beam 80 converted by the light valve 210 may become a color image.

In this way, in the illumination system 100 and the projection apparatus 200, by respectively configuring the wavelength conversion regions of different structures on the first surface 121A and the second surface 121B of the substrate 121 of the wavelength conversion module 120, the different excitation light source modules 110 may be independently controlled when the different illumination mode is selected. Therefore, the illumination system 100 makes the excitation beams 50 to irradiate the corresponding wavelength conversion regions on different surfaces of the wavelength conversion module 120. In this way, in the illumination system 100 and the projection apparatus 200, a range of each of the wavelength conversion regions on the different surfaces of the wavelength conversion module 120 may be correspondingly designed according to the requirement of the illumination mode. Since the illumination system 100 and the projection apparatus 200 under such configuration are unnecessary to enhance the energy density of the excitation beams 50 under the high chroma illumination mode, although the organic adhesion material such as silica gel, etc., is taken as the bonding material for each of the wavelength conversion regions of the wavelength conversion module 120, the energy density of the excitation beams 50 may also be controlled within a range that each of the wavelength conversion regions on the different surfaces of the wavelength conversion module 120 may withstand, so as to balance the reliability of the illumination system 100 and the projection apparatus 200 and the color performance of the output beam. Moreover, since the first region R120A and the second region R120B of the wavelength conversion module 120 respectively have a structural dual-annular design of inner and outer annular regions, the configuration design of each of the wavelength conversion regions has greater layout flexibility, so that a color mixing ratio may be adjusted more widely.

Moreover, the illumination control method of the embodiment is adapted to easily adjust the illumination beam in the aforementioned illumination system 100 and the projection apparatus 200, such that when the different illumination modes are selected, the excitation beams 50 may irradiate the corresponding wavelength conversion regions on the different surfaces of the wavelength conversion module 120, such that the finally output image beam 80 may have good color performance.

It should be noted that in the aforementioned wavelength conversion module 120, although the range of the second sub-wavelength conversion region RA of the first inner annular region R121A is different to the range of the fourth sub-wavelength conversion region RB of the second inner annular region R121B, the invention is not limited thereto. In other embodiments, the range of the second sub-wavelength conversion region RA of the first inner annular region R121A may also be the same with the range of the fourth sub-wavelength conversion region RB of the second inner annular region R121B, and the different color performance of the first illumination beam 70A or the second illumination beam 70B is achieved through other configurations. Different embodiments are described below with reference of FIG. 5A to FIG. 6B.

Figure 5A:
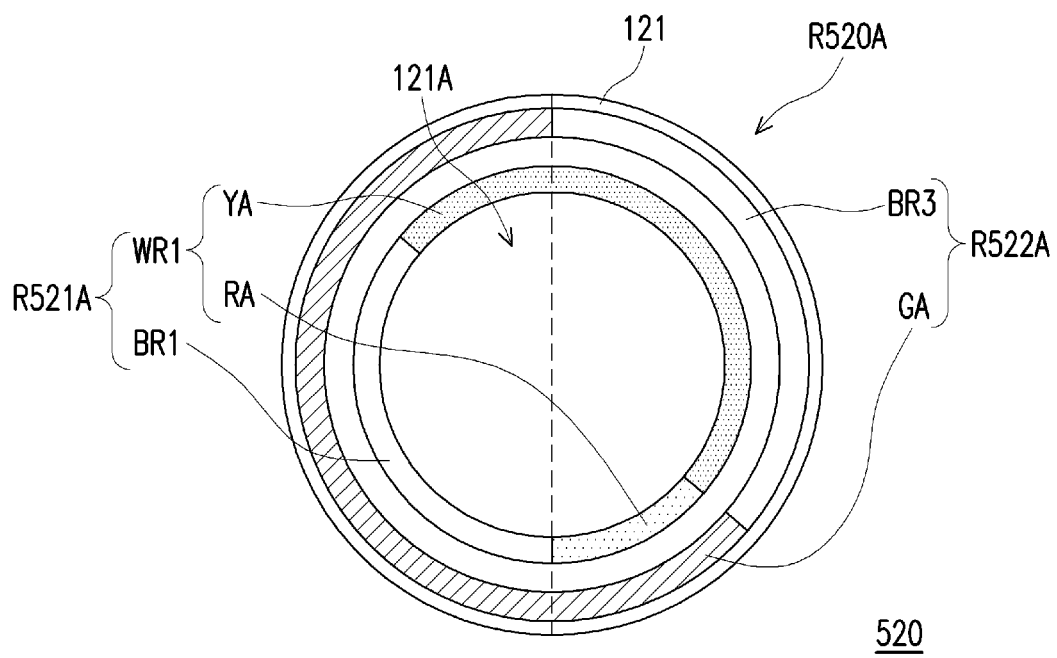
FIG. 5A and FIG. 5B are front views of a first region and a second region of another wavelength conversion module according to an embodiment of the invention.
Figure 5B:
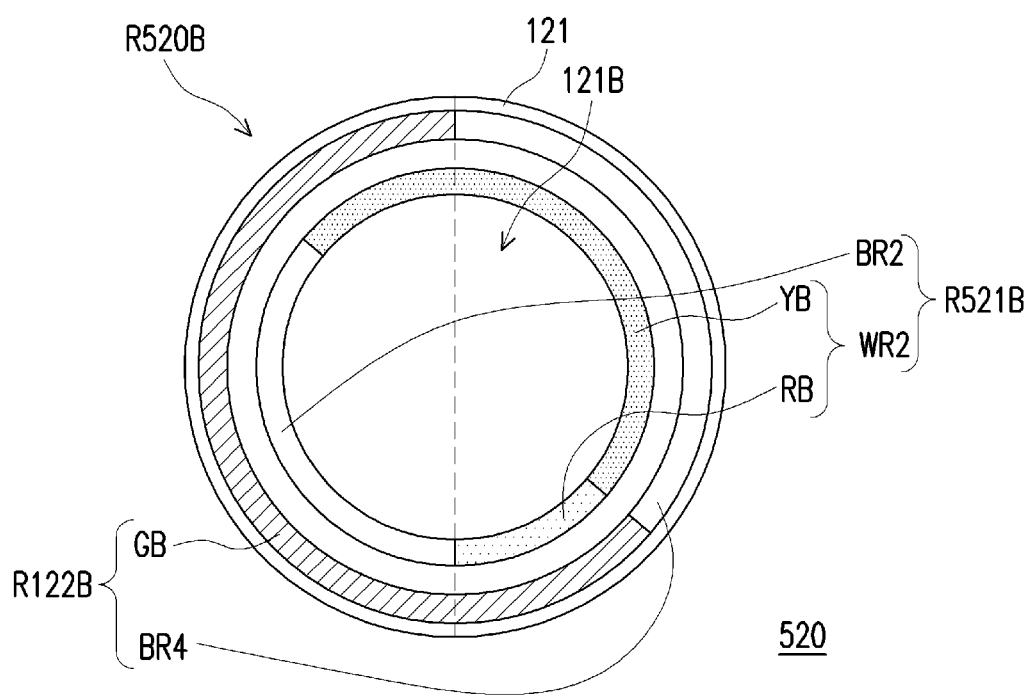

FIG. 5A and FIG. 5B are front views of a first region and a second region of another wavelength conversion module according to an embodiment of the invention. Referring to FIG. 5A and FIG. 5B, the first region R520A and the second region R520B of the wavelength conversion module 520 of the embodiment are similar to the first region R120A and the second region R120B of the wavelength conversion module 120 of FIG. 2A and FIG. 2B, and differences there between are as follows. As shown in FIG. 5A and FIG. 5B, in the embodiment, the first region R520A and the second region R520B are placed on the same reference plane, the second sub-wavelength conversion region RA of the first inner annular region R521A and the fourth sub-wavelength conversion region RB of the second inner annular region R521B have the same angle. However, in the embodiment, the first bonding material and the second bonding material are different. For example, in the embodiment, the first bonding material of the first wavelength conversion region WR1 of the first region R520A may be an inorganic adhesion material such as ceramics or silica, which is mixed with the first wavelength conversion material and sintered to form the first region R520A. Namely, the first region R520A is formed through a Phosphor in Glass (PIG) process or a Phosphor in Ceramic (PIC) process, and is adapted to withstand a higher energy density of the excitation beams 50. The second bonding material of the second wavelength conversion region WR2 of the second region R520B may be an organic adhesion material such as silica gel, etc.

Therefore, when the wavelength conversion module 520 is applied to the illumination system 100 and the projection apparatus 200 of FIG. 1, since the first wavelength conversion region WR1 of the first region R520A may withstand higher energy density of the excitation beams 50, in case of the high chroma illumination mode, the control module 130 of the illumination system 100 may increase a current intensity of the excitation beams in the time interval corresponding to the output red color light, so that the color performance of the image beam 80 may reach the expected color without causing deterioration and burning of the first wavelength conversion region WR1. On the other hand, in case of the high brightness illumination mode, the control module 130 may decrease the current intensity of the excitation beams in the time interval corresponding to the output red color light, so that the current intensity of the excitation beams in the time interval corresponding to the output green color or yellow color light is greater than that of the red color light, so as to improve the brightness of the image beam 80.

Therefore, when the wavelength conversion module 520 is applied to the illumination system 100 and the projection apparatus 200 of FIG. 1, in the illumination system 100 and the projection apparatus 200, by respectively configuring the wavelength conversion regions of different structures on the first surface 121A and the second surface 121B of the substrate 121 of the wavelength conversion module 520, the different excitation light source modules 110 may be independently controlled when the different illumination mode is selected. Therefore, the illumination system 100 makes the excitation beams 50 to irradiate the corresponding wavelength conversion regions on the different surfaces of the wavelength conversion module 520. In this way, in the illumination system 100 and the projection apparatus 200, a range or material of each of the wavelength conversion regions on the different surfaces of the wavelength conversion module 520 may be correspondingly designed according to the requirement of the illumination mode, so as to balance the reliability of the illumination system 100 and the projection apparatus 200 and the color performance of the output beam. Moreover, since the first region R520A and the second region R520B of the wavelength conversion module 520 respectively have the structural dual-annular design of inner and outer annular regions, the configuration design of each of the wavelength conversion regions has greater layout flexibility, so that a color mixing ratio may be adjusted more widely.

Moreover, the illumination system 100 and the projection apparatus 200 adopting the wavelength conversion module 520 may also execute the aforementioned illumination control method to easily adjust the illumination beams in the illumination system 100 and the projection apparatus 200, and when the different illumination modes are selected, the excitation beams 50 may irradiate the corresponding wavelength conversion regions on the different surfaces of the wavelength conversion module 520, such that the finally output image beam 80 may have good color performance, and the illumination system 100 and the projection apparatus 200 may achieve the similar effects and advantages, and detail thereof is not repeated.

Figure 6A:
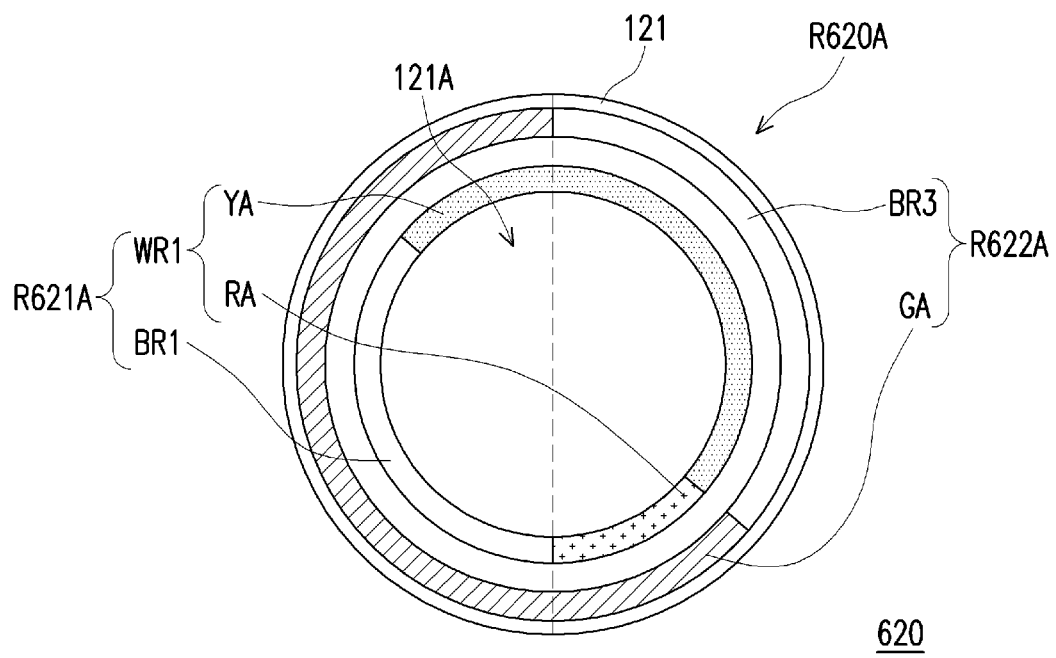
FIG. 6A and FIG. 6B are front views of a first region and a second region of still another wavelength conversion module according to an embodiment of the invention.
Figure 6B:
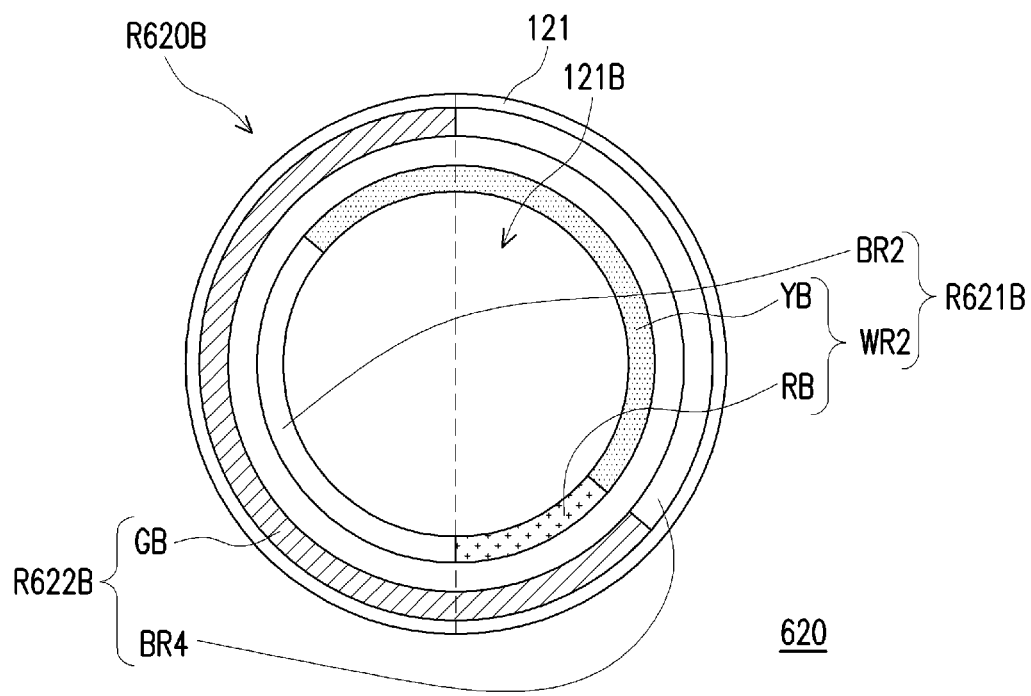

FIG. 6A and FIG. 6B are front views of a first region and a second region of still another wavelength conversion module according to an embodiment of the invention. Referring to FIG. 6A and FIG. 6B, the first region R620A and the second region R620B of the wavelength conversion module 620 of the embodiment are similar to the first region R520A and the second region R520B of the wavelength conversion module 520 of FIG. 5A and FIG. 5B, and differences there between are as follows. As shown in FIG. 6A and FIG. 6B, in the embodiment, the first bonding material and the second bonding material are the same, which may be the organic adhesion material such as silica gel, etc. However, in the embodiment, the first sub-wavelength conversion region YA in the first wavelength conversion region WR1 includes a first wavelength conversion material, the second sub-wavelength conversion region RA in the first wavelength conversion region WR1 includes a second wavelength conversion material, the third sub-wavelength conversion region YB in the second wavelength conversion region WR2 includes the first wavelength conversion material, and the fourth sub-wavelength conversion region RB in the second wavelength conversion region WR2 includes the second wavelength conversion material, and a wavelength of color light formed through the second wavelength conversion material is greater than a wavelength of color light formed through the first wavelength conversion material. For example, in the embodiment, the second wavelength conversion material is, for example, a red wavelength conversion material or a long wavelength yellow wavelength conversion material.

Therefore, when the wavelength conversion module 620 is applied to the illumination system 100 of FIG. 1, and the illumination system 100 is in the high chroma illumination mode, since a wavelength of the beam converted by the second sub-wavelength conversion region RA of the first inner annular region R621A is longer, the first illumination beam 70A may have a higher proportion of red light, which satisfies a color performance requirement of the output beam.

In this way, when the wavelength conversion module 620 is applied to the illumination system 100 and the projection apparatus 200 of FIG. 1, in the illumination system 100 and the projection apparatus 200, by respectively configuring the wavelength conversion regions of different structures on the first surface 121A and the second surface 121B of the substrate 121 of the wavelength conversion module 620, the different excitation light source modules 110 may be independently controlled when the different illumination mode is selected. Therefore, the illumination system 100 makes the excitation beams 50 to irradiate the corresponding wavelength conversion regions on the different surfaces of the wavelength conversion module 620. In this way, in the illumination system 100 and the projection apparatus 200, a range or material of each of the wavelength conversion regions on the different surfaces of the wavelength conversion module 620 may be correspondingly configured according to the requirement of the illumination mode, and since the illumination system 100 and the projection apparatus 200 under such configuration are unnecessary to enhance the energy density of the excitation beams 50 under the high chroma illumination mode, although the organic adhesion material such as silica gel, etc., is taken as the bonding material for each of the wavelength conversion regions of the wavelength conversion module 620, the energy density of the excitation beams 50 may also be controlled within a range that each of the wavelength conversion regions on the different surfaces of the wavelength conversion module 620 may withstand, so as to balance the reliability of the illumination system 100 and the projection apparatus 200 and the color performance of the output beam. Moreover, since the first region R620A and the second region R620B of the wavelength conversion module 620 respectively have the structural dual-annular design of inner and outer annular regions, the configuration design of each of the wavelength conversion regions has greater layout flexibility, so that a color mixing ratio may be adjusted more widely.

Moreover, the illumination system 100 and the projection apparatus 200 adopting the wavelength conversion module 620 may also execute the aforementioned illumination control method to easily adjust the illumination beams in the illumination system 100 and the projection apparatus 200, and when the different illumination modes are selected, the excitation beams 50 may irradiate the corresponding wavelength conversion regions on the different surfaces of the wavelength conversion module 620, such that the finally output image beam 80 may have good color performance, and the illumination system 100 and the projection apparatus 200 may achieve the similar effects and advantages, and detail thereof is not repeated.

In summary, the embodiments of the invention have at least one of following advantages or effects. In the embodiments of the invention, in the illumination system and the projection apparatus, by respectively configuring the wavelength conversion regions of different structures on the first surface and the second surface of the substrate of the wavelength conversion module, the excitation beams are adapted to irradiate the corresponding wavelength conversion regions on the different surfaces of the wavelength conversion module when the different illumination modes are selected. In this way, in the illumination system and the projection apparatus, a range or material of each of the wavelength conversion regions on different surfaces of the wavelength conversion module may be correspondingly configured according to the demand of the illumination mode, so as to balance reliability of the illumination system and the projection apparatus and color performance of the output beam, and adjust a color mixing ratio more widely. Moreover, the illumination control method of the embodiment of the invention may easily adjust the illumination beam in the illumination system and the projection apparatus, such that the excitation beams may irradiate the corresponding wavelength conversion regions on different surfaces of the wavelength conversion module when different illumination modes are selected, and therefore the finally output image beam has good color performance.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An illumination system, comprising:
   a plurality of excitation light source modules, configured to respectively emit a plurality of excitation beams; and
   a wavelength conversion module, located on a transmission path of the excitation beams, and the wavelength conversion module comprising:
      a substrate, having a first surface and a second surface opposite to each other;
      a first region, located on the first surface of the substrate, and located on a transmission path of at least one of the excitation beams which is incident on the first surface, and having a first inner annular region and a first outer annular region, wherein the first outer annular region surrounds the first inner annular region; and
      a second region, located on the second surface of the substrate, and located on a transmission path of at least one of the excitation beams which is incident on the second surface, and having a second inner annular region and a second outer annular region, wherein the second outer annular region surrounds the second inner annular region,
      wherein the first inner annular region has a first reflection region and a first wavelength conversion region, and the second inner annular region has a second reflection region and a second wavelength conversion region.

2. The illumination system as claimed in claim 1, wherein the first wavelength conversion region comprises a first wavelength conversion material and a first bonding material, and the second wavelength conversion region comprises the first wavelength conversion material and a second bonding material.

3. The illumination system as claimed in claim 2, wherein the first bonding material and the second bonding material are the same.

4. The illumination system as claimed in claim 2, wherein the first bonding material and the second bonding material are different.

5. The illumination system as claimed in claim 1, wherein the first wavelength conversion region of the first inner annular region and the second wavelength conversion region of the second inner annular region have the same angle.

6. The illumination system as claimed in claim 1, wherein the first wavelength conversion region of the first inner annular region comprises a first sub-wavelength conversion region and a second sub-wavelength conversion region, the second wavelength conversion region of the second inner annular region comprises a third sub-wavelength conversion region and a fourth sub-wavelength conversion region, the first sub-wavelength conversion region corresponds to the third sub-wavelength conversion region, and the second sub-wavelength conversion region corresponds to the fourth sub-wavelength conversion region.

7. The illumination system as claimed in claim 6, wherein the second sub-wavelength conversion region of the first inner annular region and the fourth sub-wavelength conversion region of the second inner annular region have the same angle.

8. The illumination system as claimed in claim 7, wherein the first sub-wavelength conversion region in the first wavelength conversion region comprises the first wavelength conversion material, the second sub-wavelength conversion region in the first wavelength conversion region comprises a second wavelength conversion material, the third sub-wavelength conversion region in the second wavelength conversion region comprises the first wavelength conversion material, the fourth sub-wavelength conversion region in the second wavelength conversion region comprises the second wavelength conversion material, and a wavelength of color light formed through the second wavelength conversion material is greater than a wavelength of color light formed through the first wavelength conversion material.

9. The illumination system as claimed in claim 6, wherein the second sub-wavelength conversion region of the first inner annular region and the fourth sub-wavelength conversion region of the second inner annular region have different angles.

10. The illumination system as claimed in claim 6, further comprising:
   a first light splitting element, located on a transmission path of light coming from the first region, and allowing a first color light to pass through, wherein when the second sub-wavelength conversion region enters into an irradiation range of the excitation beam, the excitation beam forms the first color light through the second sub-wavelength conversion region and the first light splitting element; and
   a second light splitting element, located on a transmission path of light coming from the second region, and allowing the first color light to pass through, wherein when the fourth sub-wavelength conversion region enters into the irradiation range of the excitation beam, the excitation beam forms the first color light through the fourth sub-wavelength conversion region and the second light splitting element.

11. The illumination system as claimed in claim 1, wherein the illumination system further comprises a control module, and the illumination system has a high chroma illumination mode and a high brightness illumination mode, and when the control module controls the illumination system to be in the high chroma illumination mode, the excitation beams form a first illumination beam through the first region, and when the control module controls the illumination system to be in the high brightness illumination mode, the excitation beams form a second illumination beam through the second region.

12. The illumination system as claimed in claim 11, wherein when the illumination system is in the high chroma illumination mode, the control module controls one of the excitation light source modules to provide the excitation beams to the first region.

13. The illumination system as claimed in claim 11, wherein when the illumination system is in the high brightness illumination mode, the control module controls one of the excitation light source modules to provide the excitation beams to the second region.

14. The illumination system as claimed in claim 11, wherein each of the excitation light source modules comprises a first excitation light source and a second excitation light source, and when the illumination system is in the high chroma illumination mode, the control module respectively turns on or turns off the first excitation light source and the second excitation light source providing the excitation beams to the first region in different time intervals, so as to form the first illumination beam respectively comprising first color light, second color light, third color light and fourth color light in the different time intervals, and when the illumination system is in the high brightness illumination mode, the control module respectively turns on or turns off the first excitation light source and the second excitation light source providing the excitation beams to the second region in the different time intervals, so as to form the second illumination beam respectively comprising the first color light, the second color light, the third color light and the fourth color light in the different time intervals.

15. The illumination system as claimed in claim 14, wherein the first wavelength conversion region of the first inner annular region comprises a first sub-wavelength conversion region and a second sub-wavelength conversion region, and the first outer annular region has a third reflection region and a third wavelength conversion region, wherein when the illumination system is in the high chroma illumination mode,
the control module turns off the first excitation light source and turns on the second excitation light source in a first time interval, such that the excitation beam forms the first color light of the first illumination beam through the second sub-wavelength conversion region of the first inner annular region,
the control module turns on the first excitation light source and turns off the second excitation light source in a second time interval, such that the excitation beam forms the second color light of the first illumination beam through the third wavelength conversion region of the first outer annular region,
the control module simultaneously turns on the first excitation light source and the second excitation light source in a third time interval, and when the excitation beams irradiate the first sub-wavelength conversion region of the first inner annular region, the excitation beams form the third color light of the first illumination beam through the third wavelength conversion region of the first outer annular region and the first sub-wavelength conversion region of the first inner annular region,
when the control module simultaneously turns on the first excitation light source and the second excitation light source in a fourth time interval, and the excitation beams irradiate the first reflection region and the third reflection region, the excitation beams form the fourth color light through the first reflection region and the third reflection region.

16. The illumination system as claimed in claim 14, wherein the second wavelength conversion region of the second inner annular region comprises a third sub-wavelength conversion region and a fourth sub-wavelength conversion region, and the second outer annular region has a fourth reflection region and a fourth wavelength conversion region, wherein when the illumination system is in the high brightness illumination mode,
the control module turns off the first excitation light source and turns on the second excitation light source in a first time interval, such that the excitation beam forms the first color light of the second illumination beam through the fourth sub-wavelength conversion region of the second inner annular region,
the control module turns on the first excitation light source and turns off the second excitation light source in a second time interval, such that the excitation beam forms the second color light of the second illumination beam through the fourth sub-wavelength conversion region of the second outer annular region,
the control module simultaneously turns on the first excitation light source and the second excitation light source in a third time interval, and when the excitation beams irradiate the third sub-wavelength conversion region of the second inner annular region, the excitation beams form the third color light of the second illumination beam through the fourth wavelength conversion region of the second outer annular region and the third sub-wavelength conversion region of the second inner annular region,
when the control module simultaneously turns on the first excitation light source and the second excitation light source in a fourth time interval, and the excitation beams irradiate the second reflection region and the fourth reflection region, the excitation beams form the fourth color light through the second reflection region and the fourth reflection region.

17. A wavelength conversion module, comprising:
a substrate, having a first surface and a second surface opposite to each other;
a first region, located on the first surface of the substrate, and having a first inner annular region and a first outer annular region, wherein the first outer annular region surrounds the first inner annular region; and
a second region, located on the second surface of the substrate, and having a second inner annular region and a second outer annular region, wherein the second outer annular region surrounds the second inner annular region,
wherein the first inner annular region has a first reflection region and a first wavelength conversion region, and the second inner annular region has a second reflection region and a second wavelength conversion region.

18. A projection apparatus, comprising:
an illumination system, configured to provide an illumination beam, and comprising:
a plurality of excitation light source modules, configured to respectively emit a plurality of excitation beams; and
a wavelength conversion module, located on a transmission path of the excitation beams, and the wavelength conversion module comprising:
a substrate, having a first surface and a second surface opposite to each other;

a first region, located on the first surface of the substrate, and located on a transmission path of at least one of the excitation beams which is incident on the first surface, and having a first inner annular region and a first outer annular region, wherein the first outer annular region surrounds the first inner annular region; and a second region, located on the second surface of the substrate, and located on a transmission path of at least one of the excitation beams which is incident on the second surface, and having a second inner annular region and a second outer annular region, wherein the second outer annular region surrounds the second inner annular region, wherein the first inner annular region has a first reflection region and a first wavelength conversion region, and the second inner annular region has a second reflection region and a second wavelength conversion region;

at least one light valve, disposed on a transmission path of the illumination beam, and configured to convert the illumination beam into an image beam; and a projection lens, disposed on a transmission path of the image beam, and configured to convert the image bam into a projection beam.

19. An illumination control method, adapted to control an illumination system in a projection apparatus, the illumination system comprising a high chroma illumination mode and a high brightness illumination mode, and wherein the illumination system comprises a plurality excitation light source modules and a wavelength conversion module, the excitation light source modules are configured to respectively emit a plurality of excitation beams, and the wavelength conversion module is located on a transmission path of the excitation beams, and comprises a substrate, a first region and a second region, the substrate has a first surface and a second surface opposite to each other, the first region is located on the first surface of the substrate, and the second region is located on the second surface of the substrate, the illumination control method comprising:

when the illumination system is in the high chroma illumination mode, providing the excitation beams to the first region by one of the excitation light source modules, and forming a first illumination beam through the first region by the excitation beams; or when the illumination system is in the high brightness illumination mode, providing the excitation beams to the second region by one of the excitation light source modules, and forming a second illumination beam through the second region by the excitation beams.

20. The illumination control method as claimed in claim 19, wherein each of the excitation light source modules comprises a first excitation light source and a second excitation light source, and the illumination control method further comprises:

when the illumination system is in the high chroma illumination mode, respectively turning on or turning off the first excitation light source and the second excitation light source providing the excitation beams to the first region in different time intervals, so as to form the first illumination beam respectively comprising first color light, second color light, third color light and fourth color light in the different time intervals; and when the illumination system is in the high brightness illumination mode, respectively turning on or turning off the first excitation light source and the second excitation light source providing the excitation beams to the second region in the different time intervals, so as to form the second illumination beam respectively comprising the first color light, the second color light, the third color light and the fourth color light in the different time intervals.

21. The illumination control method as claimed in claim 20, wherein the first region has a first inner annular region and a first outer annular region, the first inner annular region has a first reflection region and a first wavelength conversion region, the first wavelength conversion region comprises a first sub-wavelength conversion region and a second sub-wavelength conversion region, the first outer annular region has a third reflection region and a third wavelength conversion region, and when the illumination system is in the high chroma illumination mode, the illumination control method further comprises:

turning off the first excitation light source and turning on the second excitation light source in a first time interval, such that the excitation beam forms the first color light of the first illumination beam through the second sub-wavelength conversion region of the first inner annular region;

turning on the first excitation light source and turning off the second excitation light source in a second time interval, such that the excitation beam forms the second color light of the first illumination beam through the third wavelength conversion region of the first outer annular region;

simultaneously turning on the first excitation light source and the second excitation light source in a third time interval, such that when the excitation beams irradiate the first sub-wavelength conversion region of the first inner annular region, the excitation beams form the third color light of the first illumination beam through the third wavelength conversion region of the first outer annular region and the first sub-wavelength conversion region of the first inner annular region; and simultaneously turning on the first excitation light source and the second excitation light source in a fourth time interval, such that when the excitation beams irradiate the first reflection region and the third reflection region, the excitation beams form the fourth color light through the first reflection region and the third reflection region.

22. The illumination control method as claimed in claim 20, wherein the second region has a second inner annular region and a second outer annular region, the second inner annular region has a second reflection region and a second wavelength conversion region, the second wavelength conversion region comprises a third sub-wavelength conversion region and a fourth sub-wavelength conversion region, the second outer annular region has a fourth reflection region and a fourth wavelength conversion region, wherein when the illumination system is in the high brightness illumination mode, the illumination control method further comprises:

turning off the first excitation light source and turning on the second excitation light source in a first time interval, such that the excitation beam forms the first color light of the second illumination beam through the fourth sub-wavelength conversion region of the second inner annular region;

turning on the first excitation light source and turning off the second excitation light source in a second time interval, such that the excitation beam forms the second color light of the second illumination beam through the fourth sub-wavelength conversion region of the second outer annular region;

simultaneously turning on the first excitation light source and the second excitation light source in a third time interval, such that when the excitation beams irradiate the third sub-wavelength conversion region of the second inner annular region, the excitation beams form the third color light of the second illumination beam through the fourth wavelength conversion region of the second outer annular region and the third sub-wavelength conversion region of the second inner annular region; and simultaneously turning on the first excitation light source and the second excitation light source in a fourth time interval, such that when the excitation beams irradiate the second reflection region and the fourth reflection region, the excitation beams form the fourth color light through the second reflection region and the fourth reflection region.

* * * * *